(12) United States Patent
Wang et al.

(10) Patent No.: US 9,989,610 B2
(45) Date of Patent: Jun. 5, 2018

(54) MULTIBAND SLICE ACCELERATED IMAGING WITH BALANCED SLICE-SELECTIVE GRADIENTS

(71) Applicants: Siemens Healthcare GmbH, Erlangen (DE); Regents of the University of Minnesota, Minneapolis, MN (US)

(72) Inventors: Dingxin Wang, Apple Valley, MN (US); Vibhas Deshpande, Austin, TX (US); Xiufeng Li, Shoreview, MN (US); Kamil Ugurbil, Minneapolis, MN (US)

(73) Assignees: Siemens Healthcare GmbH, Erlangen (DE); Regents of the University of Minnesota, Minneapolis, MN (US)

( * ) Notice: Subject to any disclaimer, the term of this patent is extended or adjusted under 35 U.S.C. 154(b) by 541 days.

(21) Appl. No.: 14/521,976

(22) Filed: Oct. 23, 2014

(65) Prior Publication Data

US 2015/0115958 A1    Apr. 30, 2015

Related U.S. Application Data

(60) Provisional application No. 61/894,992, filed on Oct. 24, 2013.

(51) Int. Cl.
  *G01R 33/48*  (2006.01)
  *G01R 33/561*  (2006.01)
  *G01R 33/483*  (2006.01)

(52) U.S. Cl.
  CPC ...... *G01R 33/5611* (2013.01); *G01R 33/4835* (2013.01); *G01R 33/5616* (2013.01); *G01R 33/5617* (2013.01)

(58) Field of Classification Search
  CPC ............ G01R 33/5611; G01R 33/4835; G01R 33/5616; G01R 33/5617
  See application file for complete search history.

(56) References Cited

U.S. PATENT DOCUMENTS

| | | | | |
|---|---|---|---|---|
| 2012/0056620 A1* | 3/2012 | Feinberg | ............ | G01R 33/4835 324/309 |
| 2013/0099784 A1* | 4/2013 | Setsompop | ............ | G01R 33/54 324/309 |
| 2014/0225612 A1* | 8/2014 | Polimeni | ................ | G01R 33/48 324/309 |
| 2014/0253120 A1* | 9/2014 | Ugurbil | .................. | A61B 5/055 324/309 |

(Continued)

OTHER PUBLICATIONS

Hargreaves, B (Rapid Gradient-Echo Imaging), J Magn Reson Imaging Dec. 2012 36(6) 1300-1313.*

(Continued)

*Primary Examiner* — Clayton E LaBalle
*Assistant Examiner* — Ruifeng Pu

(57) ABSTRACT

A computer-implemented method for performing multi-band slice accelerated imaging includes performing a low-resolution fast multi-dimensional reference scan to obtain a coil sensitivity map. A multiband imaging scan is performed to acquire a plurality of k-space lines representative of an anatomical area of interest. A multi-band signal corresponding to the plurality of k-space lines is separated into a plurality of image slices using a parallel imaging reconstruction technique and the coil sensitivity map.

20 Claims, 6 Drawing Sheets

(56) References Cited

U.S. PATENT DOCUMENTS

2015/0115958 A1* 4/2015 Wang ................. G01R 33/4835
324/309
2015/0241537 A1* 8/2015 Dannels ........... G01R 33/56554
324/309

OTHER PUBLICATIONS

Norris, D. G., Boyacioğlu, R., Schulz, J., Barth, M. and Koopmans, P. J. (2014), Application of PINS radiofrequency pulses to reduce power deposition in RARE/turbo spin echo imaging of the human head. Magn Reson Med, 71: 44-49.

* cited by examiner

MULTIBAND SLICE ACCELERATED IMAGING WITH BALANCED SLICE-SELECTIVE GRADIENTS

CROSS-REFERENCE TO RELATED APPLICATIONS

This application claims priority to U.S. provisional application Ser. No. 61/894,992 filed Oct. 24, 2013, which is incorporated herein by reference in its entirety.

This invention was made with government support under PB41EB015894 awarded by the National Institutes of Health. The government has certain rights in the invention.

TECHNOLOGY FIELD

The present invention relates generally to methods, systems, and apparatuses related to a generalized process for performing simultaneous multi-slice Magnetic Resonance Imaging (MRI) using multi-band excitation. The disclosed methods, systems, and apparatuses may be applied, for example, to improve the overall scan time required by MRI applications.

BACKGROUND

Multiband slice accelerated imaging has recently been demonstrated in gradient recalled echo (GRE) and echo planner imaging (EPI) sequences to improve imaging efficiency. In a multiband acquisition, two or more slices are excited simultaneously using a multiband RF pulse and the signals from all slices are acquired simultaneously by multiple receive coils. These aliased signals can be unwrapped by using the receive coil sensitivity profiles to generate separated images of the independent slices. This method offers acceleration in imaging speed equal to the number of slices that are excited simultaneously.

One of the key components of a multiband acquisition is to measure the spatial sensitivity profiles of the receive coils prior to multiband image reconstruction, typically with the acquisition of an unaccelerated, or "single-band," reference scan. These sensitivity profiles are used during parallel imaging reconstruction to separate the aliased slices. In conventional multiband imaging methods, the single band reference scan is acquired using identical imaging sequence as the slice accelerated scan. However, such a reference scan acquisition is not efficient with sequences such as spin echo (SE), turbo spin echo (TSE), and GRE with long TRs, sequences with high spatial resolution, and sequences with magnetization preparation. Furthermore, if there are no repeated measurements required, a full single-band reference scan obviates the need for any following slice accelerated imaging scan.

Another key component of robust multiband acquisition is to minimize noise amplification and residual aliasing artifact after parallel imaging reconstruction. By introducing desired field-of-view (FOV) shift through modulating the phase of the multiband RF excitation pulse among simultaneously acquired slices, the Controlled Aliasing In Parallel Imaging Results In Higher Acceleration (CAIPIRINHA) technique effectively increases the distance between aliased pixels and improves slice separation with reduced G-factor penalty and residual aliasing artifact. While this RF modulation CAIPIRINHA approach can be used for conventional SE, GRE, and steady-state free precession (SSFP) acquisitions, where one phase-encoding (PE) line of k-space is acquired following each excitation, it is not applicable to sequences that acquire multiple k-space lines after one excitation, such as EPI and TSE. Following the idea of line by line phase modulation, slice-selective gradients blips were introduced to generate phase modulation on k-space lines of an EPI sequence for FOV shifting. With proper cycling sets of slice-selective gradients blips across k-space lines, the blipped CAIPIRINHA method allows desired FOV shift with substantially mitigated phase accruals along the phase-encoding direction, thus minimizing voxel titling and slice blurriness for an EPI sequence. However, the conventional blipped CAIPIRINHA method is not suitable for sequences using refocusing RF pulses to generate additional spin echoes such as, for example, TSE, half-fourier acquisition single-shot turbo spin-echo (HASTE), and gradient and spin echo (GRASE). Because the blipped CAIPIRINHA method applies only one gradient blip to achieve desired accumulated gradient moment for phase modulation of each k-space line, it will keep various phase accruals across refocusing RF pulses to the following readouts, which violates the critical Carr Purcell Meiboom Gill (CPMG) conditions. In addition, the blipped CAIPIRINHA method is not compatible with the balanced SSFP sequence either, because the gradient blip induced phase is not balanced before the subsequent RF excitation.

SUMMARY

Embodiments of the present invention address and overcome one or more of the above shortcomings and drawbacks, by providing methods, systems, and apparatuses related to a generalized process for performing simultaneous multi-slice or multi-slab Magnetic Resonance Imaging (MRI) using multiband RF excitation. The overlapped signals from simultaneously excited slices/slabs can be separated by utilizing the different spatial sensitivities of the multiple receiver coils. Separation of these aliased signals utilizes the knowledge of the receiver coil sensitivity profiles estimated from a reference scan. The techniques described herein enable generalized multiband slice accelerated imaging for any type of 2D and 3D MR pulse sequence including, without limitation, spin-echo (SE), turbo spin-echo (TSE), 3D TSE with Variable Flip Angle, gradient echo (GRE), half-Fourier acquisition single-shot turbo spin-echo (HASTE), GRASE, steady state free precession (SSFP), echo planar imaging (EPI), and fly-back EPI as well as sequences prepared with saturation recovery, inversion recovery, multiple inversion recovery, FLAIR, T2-weighting, diffusion weighting, and phase modulation such as MR Elastography acquisitions.

According to some embodiments of the present invention, a computer-implemented method for performing multi-band slice accelerated imaging includes performing a low-resolution fast multi-dimensional reference scan to obtain a coil sensitivity map. This low-resolution fast multi-dimensional reference scan may correspond to, for example, a multi-slice 2D or a single-slab 3D or a multi-slab 3D image scan. A multiband imaging scan is performed to acquire a plurality of k-space lines representative of an anatomical area of interest. The multi-band signal corresponding to the plurality of k-space lines is separated into a plurality of image slices using a parallel imaging reconstruction technique and the coil sensitivity map.

Various modifications, refinements, and/or enhancements may be applied to aforementioned method for performing multi-band slice accelerated imaging in different embodiments of the present invention. For example, in some embodiments, the method includes receiving an indication of a desired FOV shift utilizing balanced slice-selective gradients. Then, the gradient moment rewinding process may be applied after acquisition of each k-space line during the multiband imaging scan to achieve the desired FOV shift. In one embodiment, the balanced slice-selective gradients include a first slice-selective gradient applied prior to acquisition of each k-space line to set a gradient moment to a phase modulation corresponding to the desired FOV shift and a second slice-selective gradient applied during the gradient moment rewinding process to set the gradient moment to zero in a slice direction.

Additionally, the details of the scans performed in the aforementioned method may vary. In one embodiment, the low-resolution fast multi-dimensional reference scan and the multiband imaging scan are each associated with a different image contrast. In another embodiment, the low-resolution fast multi-dimensional reference scan and the multiband imaging scan are each associated with a different spatial resolution. The dimensionality of the scans may or may not be mixed. For example, in one embodiment, the low-resolution fast multi-dimensional reference scan corresponds to a multi-slice 2D scan and the multiband imaging scan corresponds to a 2D multi-slice or 3D image scan. Additionally, the reference scan may apply slab imaging techniques. For example, in one embodiment, the low-resolution fast multi-dimensional reference scan corresponds to a single-slab or multi-slab 3D image scan, while the multiband imaging scan corresponds to a 2D multi-slice, 3D image scan, or multi-slab scan.

According to another aspect of the present invention, as described by some embodiments herein, a method for performing multi-band slice accelerated imaging with balanced slice-selective gradients includes receiving an indication of a desired FOV shift and determining a phase modulation value based on that desired FOV shift. In some embodiments, the desired FOV shift corresponds to a one-half FOV shift and the phase modulation value alternates between 0 degrees and 180 degrees for consecutive k-space lines during the multiband imaging scan. In other embodiments, the desired FOV shift corresponds to a one-third FOV shift and the phase modulation value cycles over values comprising 0 degrees, 120 degrees, and 240 degrees for consecutive k-space lines during the multiband imaging scan. Once the phase modulation value has been determined, a multiband imaging scan is performed to acquire k-space lines representative of an anatomical area of interest. The multiband imaging scan utilizes a balanced slice-selective gradient process wherein, before the readout of each k-space line, a first slice-selective gradient is applied to set a gradient moment to the phase modulation value. Then, after the readout of each k-space line, a second slice-selective gradient is applied to set the gradient moment to zero in a slice direction.

The aforementioned method for performing multi-band slice accelerated imaging with balanced slice-selective gradients may be modified, refined, and/or enhanced with additional features in some embodiments of the present invention. For example, in some embodiments, the multi-band imaging scan simultaneously excites multiple slabs in the anatomical area of interest. In some embodiments, a multi-dimensional reference scan is performed using a low resolution fast imaging sequence to obtain a coil sensitivity map. Then aliased slices in the plurality of k-space lines are separated using a parallel imaging reconstruction technique and the coil sensitivity map. In some embodiments of the present invention, the plurality of k-space lines are converted into image space data. Then, the aliased slices in the image space data are separated using, for example, a phase-offset multi-planar (POMP) imaging technique or a phase-offset Hadamard encoding imaging technique. Additionally, the trajectory may be varied. For example, in some embodiments, the multiband imaging scan utilizes a non-Cartesian k-space trajectory.

According to another aspect of the present invention, as described by some embodiments herein, a system for performing multi-band slice accelerated imaging includes a plurality of imaging coils and a central control computer. The imaging coils include gradient coils and radio-frequency (RF) coils. The central control computer obtains a coil sensitivity map by performing a low-resolution fast multi-dimensional reference scan using the plurality of imaging coils. Next, the central control computer performs a multiband imaging scan using the imaging coils. During this scan, the gradient coils apply balanced slice-selective gradients and the RF coils acquire a plurality of k-space lines representative of an anatomical area of interest. Then, the computer separates a multi-band signal corresponding to the k-space lines into image slices using a parallel imaging reconstruction technique and the coil sensitivity map.

In some embodiments, the aforementioned system includes an operator interface configured to receive an indication of a desired FOV shift. The gradient moment rewinding process may then be applied after acquisition of each k-space line during the multiband imaging scan to achieve the desired FOV shift. In some embodiments, the central control computer is further configured to utilize the plurality of gradient coils to apply a first slice-selective gradient prior to acquisition of each k-space line to set a gradient moment to a phase modulation corresponding to the desired FOV shift and then apply a second slice-selective gradient during the gradient moment rewinding process to set the gradient moment to zero in a slice direction. Additionally, in some embodiments, the central control computer may modify the multiband imaging scan such that the imaging coils simultaneously excite multiple slabs in the anatomical area of interest during the multiband imaging scan.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

The following disclosure describes the present invention according to several embodiments directed at methods, systems, and apparatuses related to a generalized process for simultaneous multi-slice/multi-slab multiband slice accelerated imaging. In various embodiments described herein this process utilizes a sequence for reference scan that different from the intended multiband imaging scan sequence, preferably with higher acquisition efficiency. Additionally, in some embodiments, the process utilizes balanced slice-selective gradients with gradient moment rewinding after acquisition of each PE line in k-space to achieve the desired FOV shift. The proposed decoupling of the reference and imaging acquisition and balanced slice-selective gradients for phase modulation enables multiband slice accelerated imaging for any 2D and 3D MR pulse sequence.

Figure 1:
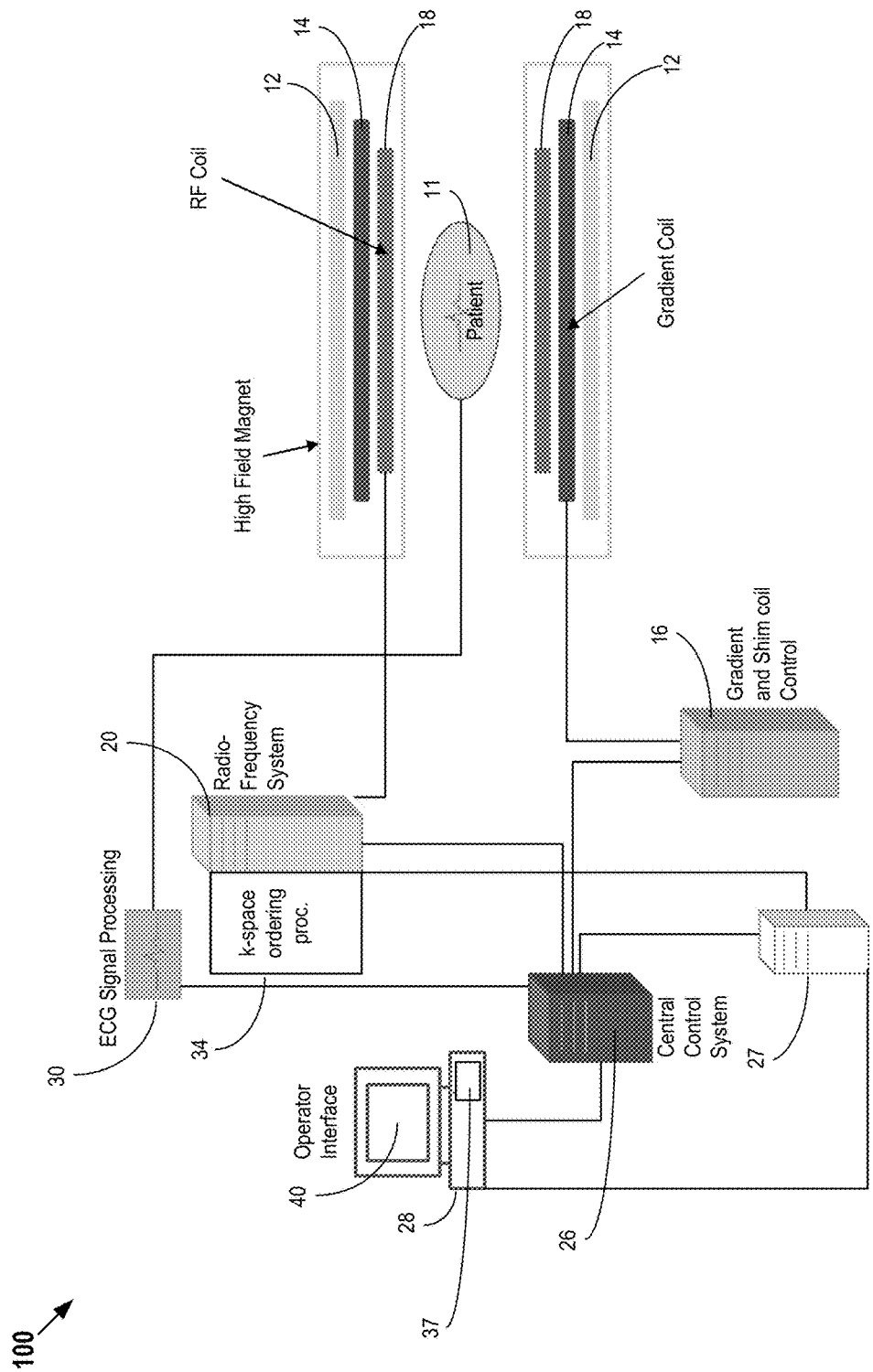
FIG. 1 shows a system for ordering acquisition of frequency domain components representing MRI data for storage in a k-space storage array, as used by some embodiments of the present invention.

FIG. 1 shows a system 100 for ordering acquisition of frequency domain components representing MR image data for storage in a k-space storage array, as used by some embodiments of the present invention. In system 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF (radio frequency) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11. As described in greater detail below, in some embodiments, the central control unit 26 directs the various components of the system 100 to perform multi-band slice accelerated imaging with balanced slice-selective gradients.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide an MR dataset to an image data processor for processing into an image. In some embodiments, the image data processor is located in central control unit 26. However, in other embodiments such as the one depicted in FIG. 1, the image data processor is located in a separate unit 27. Electrocardiography (ECG) synchronization signal generator 30 provides ECG signals used for pulse sequence and imaging synchronization. A two or three dimensional k-space storage array of individual data elements in k-space component processor unit 34 stores corresponding individual frequency components comprising an MR dataset. The k-space array of individual data elements has a designated center and individual data elements individually have a radius to the designated center;

A magnetic field generator (comprising coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components is sequentially acquired during acquisition of an MR dataset representing an MR image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control unit 26 uses information stored in an internal database to process the detected MR signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control unit 26 and enables user modification of magnetic resonance imaging signals in substantially real time. Display processor 37 processes the magnetic resonance signals to provide image representative data for display on display 40, for example.

The system 100 described in FIG. 1 may be used to perform a generalized method of simultaneous multi-slice/multi-slab multiband slice accelerated imaging. For example, in some embodiments, the reference scan for estimating the coil sensitivity profile for multiband slice/slab separation is acquired using a sequence different than the intended multiband imaging sequence. The reference scan is configured to have comparable spatial coverage and matching coil selection to the accelerated scan in order to adequately estimate the coil sensitivity profile for multiband unaliasing. In some embodiments, for easier reconstruction, the imaging volume and slice thickness of the reference scan and accelerated scan are matched. The reference scan may also have different image contrast and different spatial resolution than the imaging scan. The lack of any restrictions on the reference scan allows time efficient acquisition of the reference data, such that the time savings from slice accelerated imaging scan may be preserved.

Figure 2A:
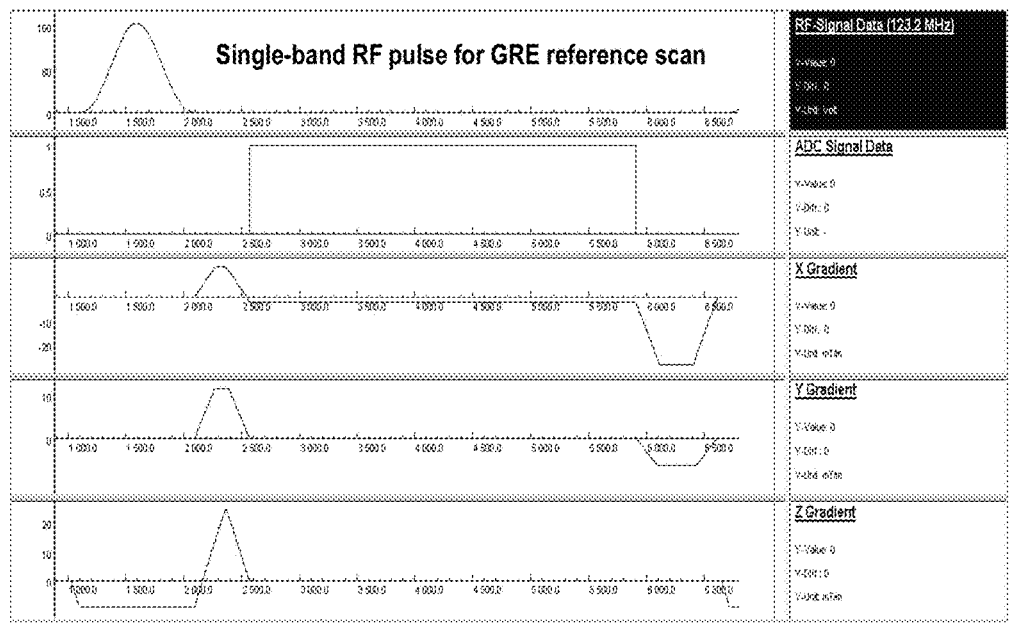
FIG. 2A shows a fast low resolution GRE reference scan, as may be applied using the techniques described herein. In this example, a single-band RF pulse is used for excitation.
Figure 2B:
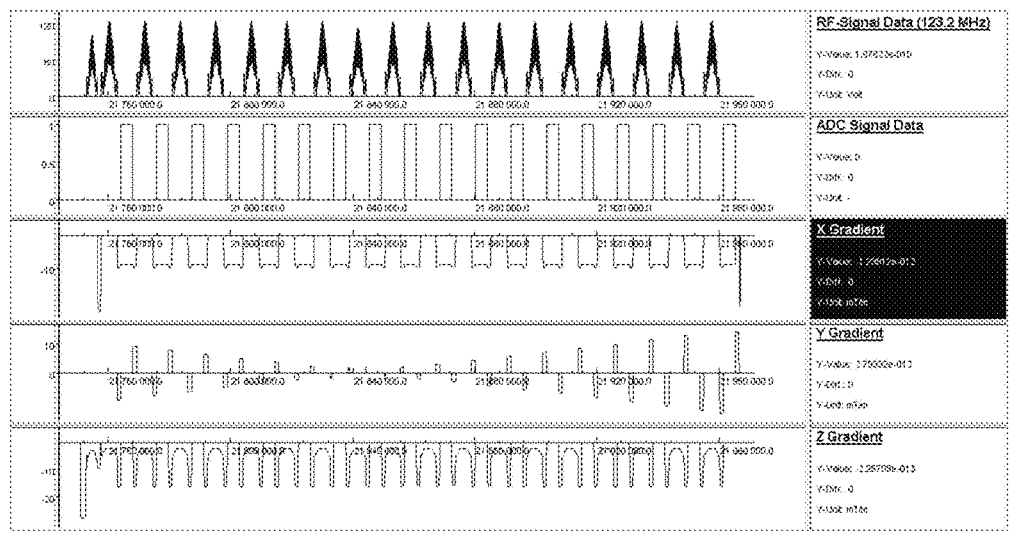
FIG. 2B shows the high resolution multiband slice accelerated TSE sequence, as may be applied some embodiments of the present invention.

FIGS. 2A and 2B show application of performing multi-band slice accelerated imaging with balanced slice-selective gradients according to some embodiments of the present invention. More specifically, FIG. 2A shows a fast low resolution GRE reference scan, as may be applied using the techniques described herein. In this example, a single-band RF pulse is used for excitation. FIG. 2B shows the high resolution multiband slice accelerated TSE sequence, as may be applied some embodiments of the present invention. In this sequence, multiband RF pulses that excite and focus 3 slices simultaneously are used for data acquisition, thereby allowing for a 3-fold increase in imaging efficiency.

Continuing with the example illustrated in FIGS. 2A and 2B, with a TR of 270 ms and acquisition matrix of 64×64 points, the total acquisition time for the GRE reference scan for 48 slices is only 17 sec. The time to acquire the 3 times accelerated TSE with repetition time equal to 4000 ms, echo train length equal to 18, and a 320×320 matrix size is 1 minute, 16 seconds. Thus, the total acquisition time for the 48 slices TSE images is 1 minute and 33 seconds. In comparison, the total imaging time for a conventional single-band TSE sequence with the same imaging parameters is 3 minutes and 48 seconds. Therefore, the fast GRE reference scan combining with multiband slice accelerated TSE sequence provides significant time saving over the traditional single-band TSE acquisition approach.

Using the techniques described herein, balanced slice-selective gradients may be utilized to achieve a desired FOV shift for multiband slice accelerated imaging. For example, in some embodiments, a generalized gradient-based Controlled Aliasing in Parallel Imaging Results in Higher Acceleration (CAIPIRINHA) method uses paired, balanced slice-selective gradients for phase modulation of each k-space line. Before the readout of each PE line, a slice-selective gradient is applied to generate the desired gradient moment for phase modulation ($\Delta\varphi$). For example, for a half FOV shift, $\Delta\varphi$ alternates between 0° and 180° for consecutive k-space lines. The relationship between added phase and gradient moment is given by $\Delta\varphi=\gamma Gz\Delta zt$, where $\gamma$ is the gyromagnetic ratio of the imaged species, Gz is the amplitude of the slice-selective gradient, t is the duration of the gradient, and $\Delta z$ is the spacing between multiband slices. After readout of each k-space line, a balanced slice-selective rewinder gradient is applied to drive the gradient moment back to zero in the slice direction before the next readout. This is similar to applying the phase-encoding gradients in the slice direction with a 3D sequence.

The balancing of the gradients discussed above adds no additional phase before the next readout. Therefore, there is no pixel tilting or image blurring issue associated with these added CAIPIRINHA gradients. This characteristic is particularly important for sequences using refocusing RF pulses to generate echo trains, as it satisfies the Carr Purcell Meiboom Gill (CPMG) condition that requires identical phase accumulation between refocusing RF pulses. The same feature is also important for the balanced pulse sequences (e.g., bSSFP), because the gradient induced phase is fully balanced before the subsequent RF excitation. This generalized design not only makes the calculation of the slice gradient moment for each PE line straightforward, but also enables its generic application to any type of 2D and 3D sequences including, without limitation, GRE, SE, TSE, HASTE, GRASE, EPI, fly-back EPI, SSFP and SPACE sequences.

The paired, balanced slice-selective gradients approach described herein can be applied to control desired phase shift not only in PE direction but also in slice-encoding direction for 3D sequence, which can be important for simultaneous multi-slab multiband 3D imaging. The FOV shift introduced by the balanced gradients may also be used for other multiband imaging methods which do not utilize parallel imaging reconstruction to separate aliased slices such as, for example, a phase-offset multi-planar (POMP) or a Hadamard encoding imaging methods. If necessary, once k-space data has been acquired, it may be converted to image space so that one of these methods may be applied. In addition, in some embodiments, multi-band slice accelerated imaging with balanced slice-selective gradients is applied to CAIPIRINHA with non-Cartesian k-space trajectory, such as radial and spiral.

Figure 3:
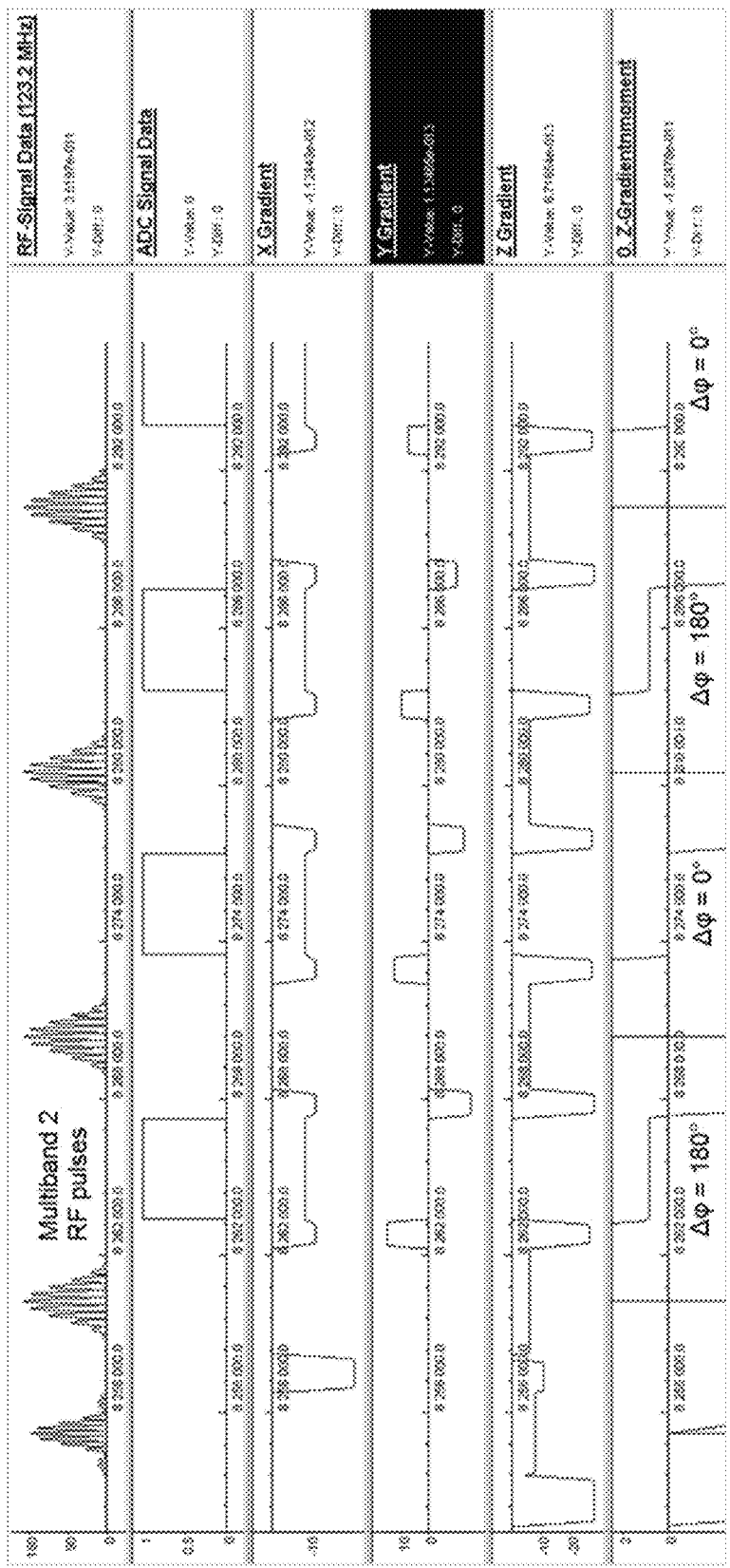
FIG. 3 provides and illustration of a multiband TSE sequence with 2 times slice acceleration and one-half FOV shift CAIPIRINHA, as may be implemented in some embodiments of the present invention.

FIG. 3 provides an illustration of a multiband TSE sequence with 2 times slice acceleration and one-half FOV shift CAIPIRINHA, as may be implemented in some embodiments of the present invention. In this sequence, multiband RF pulses that excite and focus 2 slices simultaneously are used for data acquisition. Phase modulation of $\Delta\varphi=0°$ and 180° for different k-space lines are provided by the balanced slice-selective gradients jointly with crusher gradients in the slice direction. After readout of each k-space line and before the next refocusing RF pulse, the net gradient moment from each pair of the balanced CAIPIRINHA gradients is always zero. CPMG conditions are satisfied in this sequence.

Figure 4:
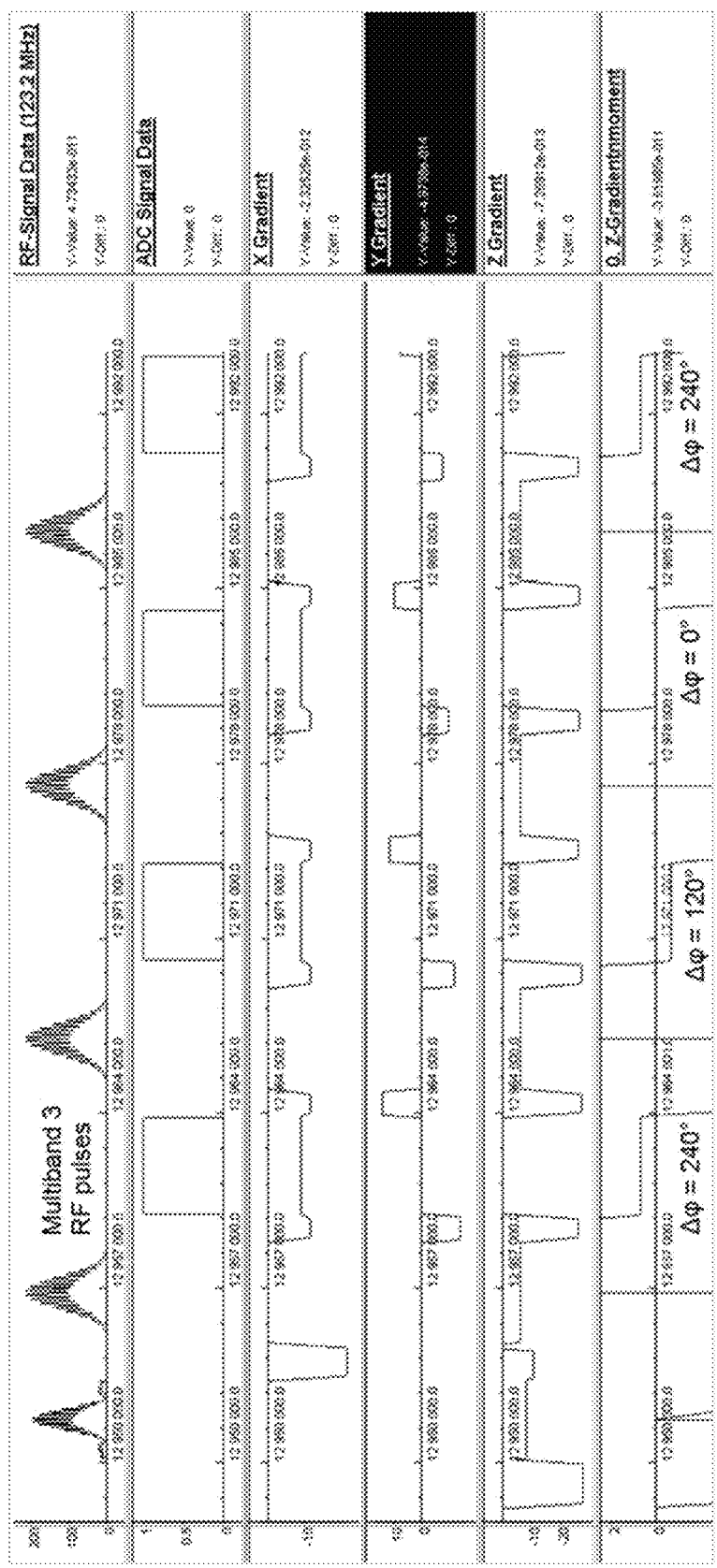
FIG. 4 shows another example of a multiband TSE sequence that excites 3 slices simultaneously with one-third FOV shift CAIPIRINHA, according to some embodiments of the present invention.

FIG. 4 shows another example of a multiband TSE sequence that excites 3 slices simultaneously with one-third FOV shift CAIPIRINHA, according to some embodiments of the present invention. In this sequence, multiband RF pulses that excite and focus 3 slices simultaneously are used for data acquisition. Balanced slice-selective gradients induced $\Delta\varphi$ is switched between 0°, 120°, and 240° depending on k-space line number. After readout of each k-space line and before next refocusing RF pulse, there is no accumulated gradient moment in slice direction and no phase accrual from each pair of the balanced gradients. CPMG conditions are satisfied in this sequence.

In some embodiments, the multiband signals from simultaneously excited multiple slices or slabs can be separated using parallel imaging reconstruction techniques. The slice separation process utilizes multiple RF receiver coils spatial encoding information estimated from the aforementioned GRE reference scan. With CAIPIRINHA, the noise amplification and residual aliasing artifact can be largely reduced. The proposed generalized method for multiband slice accelerated imaging can be combined with in-plane parallel imaging techniques to further improve imaging efficiency.

Figure 5:
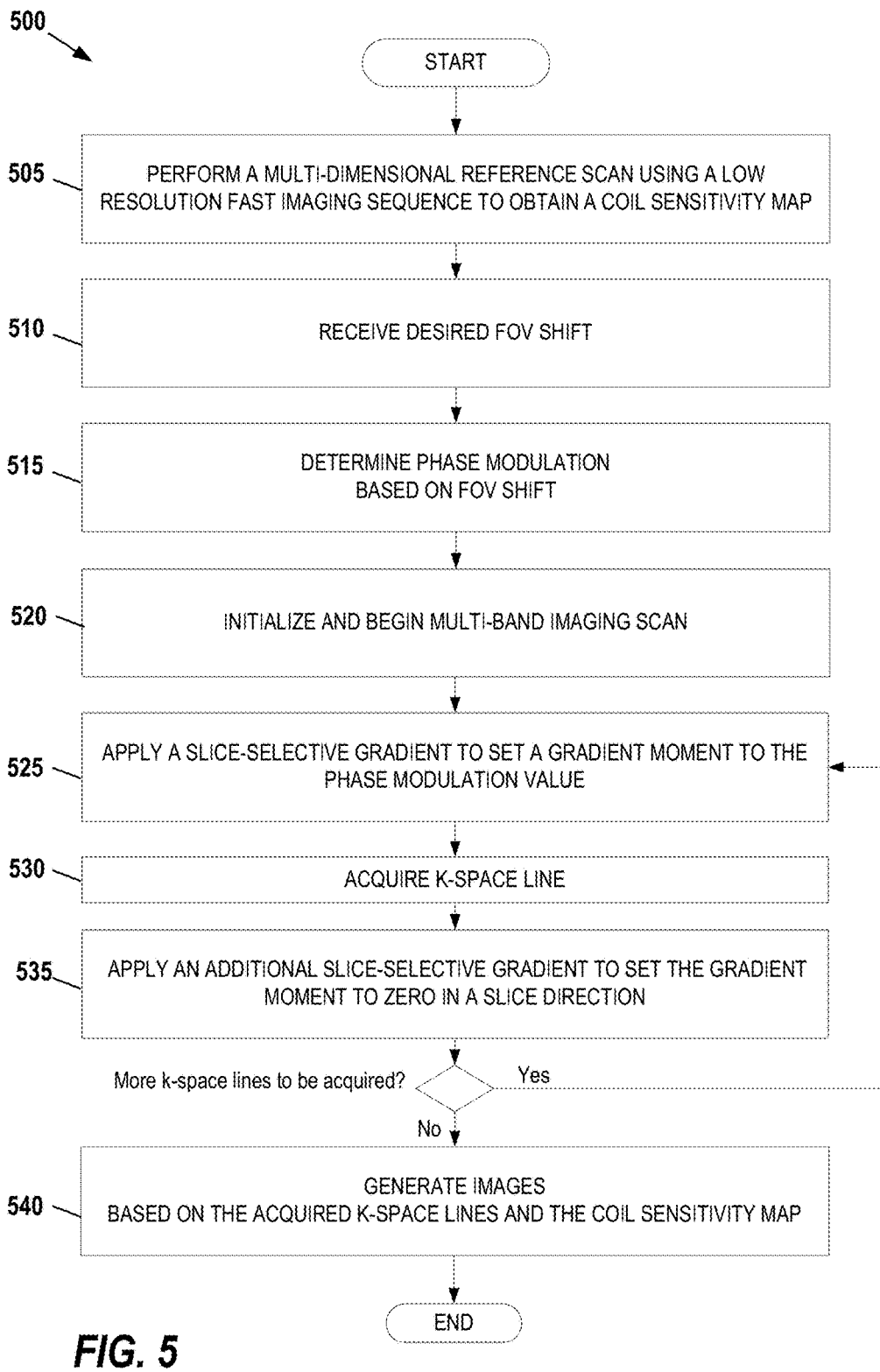
FIG. 5 provides an example process for performing multiband slice accelerated imaging with balanced slice-selective gradients, according to some embodiments of the present invention.

FIG. 5 provides an example process 500 for performing multi-band slice accelerated imaging with balanced slice-selective gradients, according to some embodiments of the present invention. The process 500 may be applied, for example, using the system 100 described above with reference to FIG. 1. At 505, a multi-dimensional reference scan is performed using a low resolution fast imaging sequence to obtain a coil sensitivity map. The reference scan can be acquired, for example, using a 2D multi-slice sequence, a 3D single-slab sequence, or a 3D multi-slab sequence. In addition, the reference scan may be acquired separately from or jointly with the multiband imaging scan discussed below with respect to step 520. Various pulse sequences may be utilized with the reference scan including, without limitation, SE, TSE, HASTE, GRASE, GRE, SSFP, EPI, fly-back EPI, SPACE sequences with magnetization preparation, as well as sequences sampled with Cartesian, radial, PROPELLER, or spiral k-space trajectory.

At 510, an indication of a desired FOV shift is received. The desired FOV shift may be specified, for example, by an operator of the device performing the process 500. Alternatively, the desired FOV shift may be determined automatically based one or more other system settings (e.g., desired resolution, type of object being imaged, etc.) and provided to device performing the process 500. Next, at 515, a phase modulation value is determined based on the desired FOV shift. The correspondence between the phase modulation and the FOV shift may be based on the characteristics of the multiband imaging scan to be applied. For example, for a multi-slice applications utilizing Controlled Aliasing in Parallel Imaging Results in Higher Acceleration (CAIPIRINHA), a one-half FOV shift in the images of every other slice may be achieved by modulating the phase of the RF excitation pulse used to acquire every other line of k-space by 180 degrees. Then, later when the resulting image slices are superimposed on one another, every-other slice will be shifted by one-half of the FOV.

A multiband imaging scan is initialized and applied beginning at step 520 to acquire a plurality of k-space lines representative of an anatomical area of interest. The exact implementation of the multiband imaging scan may vary according to the different embodiments of the present invention. In the example of FIG. 5, that multiband imaging scan utilizes a multi-step balanced slice-selective gradient process to acquire a plurality of k-space lines. At 525, before readout of each k-space line, a slice-selective gradient is applied to set a gradient moment to the phase modulation value. At 530, the k-space line is acquired. Next, at 535, after the readout of each k-space line, an additional slice-selective gradient is applied to set the gradient moment to zero in a slice direction. Steps 525, 530, and 535 are repeated until all k-space lines are acquired. Then, at 540, one or more images of the anatomical area of interest generating using the acquired k-space lines and the coil sensitivity map.

The techniques described herein provide several benefits over conventional imaging processes. For example, multiband slice accelerated imaging improves MR imaging efficiency by a factor equal to the number of simultaneously excited slices/slabs. Moreover, decoupling of reference scan sequence from the imaging scan sequence makes a generalized technique for multiband imaging, and enables any MR 2D/3D pulse sequence to exploit the advantages of multiband imaging. In addition, balancing the gradients used for FOV shift phase modulation enables generalized application of techniques like CAIPIRINHA to any MR 2D/3D pulse sequence for reducing g-factor penalty and residual aliasing artifact with multiband imaging.

The techniques described herein have a very wide range of clinical applications. For example, multiband slice accelerated imaging of clinical sequences can shorten total acquisition time or improve the spatial coverage within a given imaging time. SE, TSE, GRE, and SSFP sequences and variant versions of these sequences are used for most clinical applications in brain, spine, musculoskeletal, body, and cardiac imaging. Potentially, all these applications can benefit from one or more of the techniques described herein.

Figure 6:
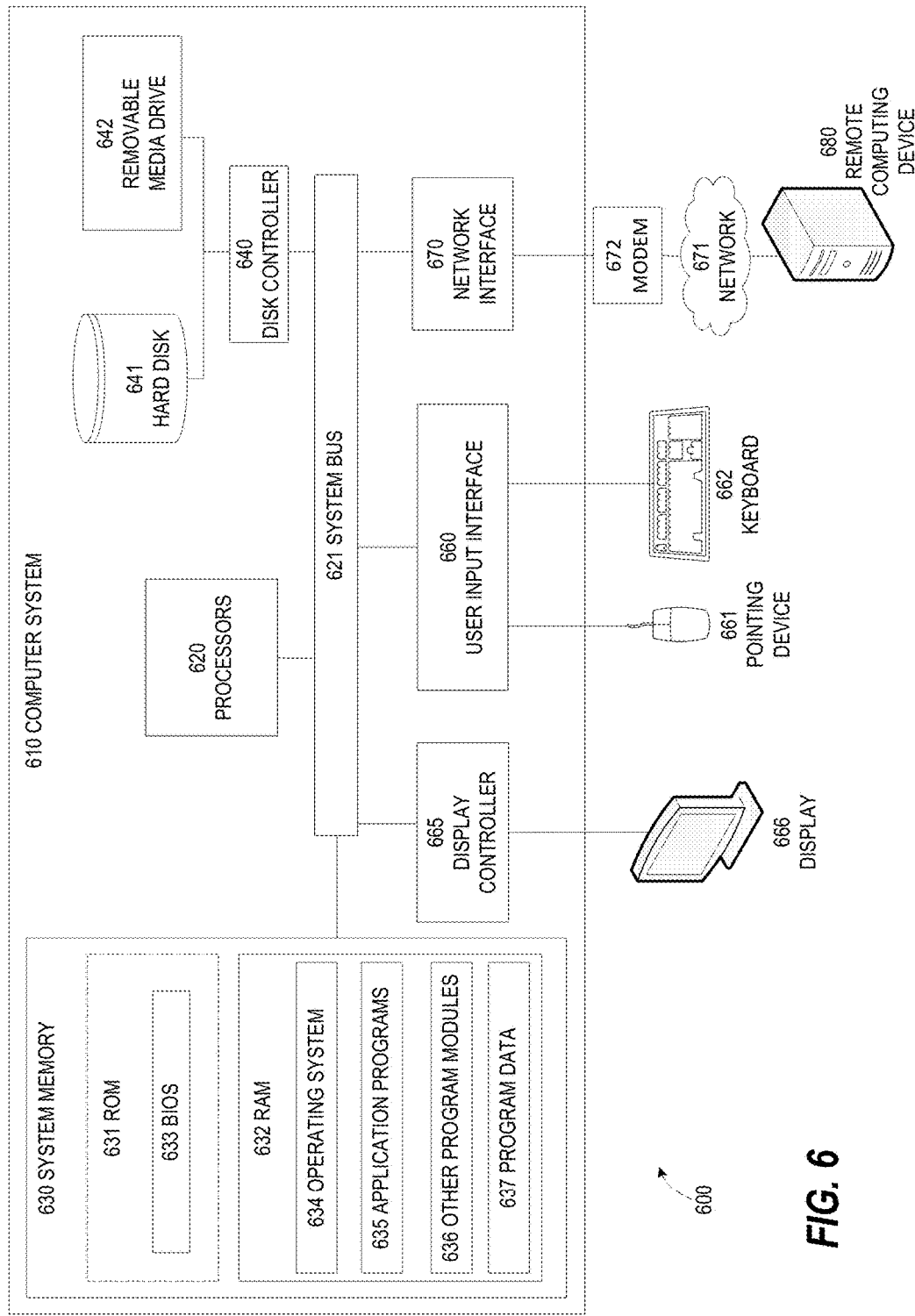
FIG. 6 illustrates an exemplary computing environment within which embodiments of the invention may be implemented.

FIG. 6 illustrates an exemplary computing environment 600 within which embodiments of the invention may be implemented. For example, this computing environment 600 may be used as part of the system 100 (see FIG. 1) to implement the process 500 described in FIG. 5. The computing environment 600 may include computer system 610, which is one example of a computing system upon which embodiments of the invention may be implemented. Computers and computing environments, such as computer system 610 and computing environment 600, are known to those of skill in the art and thus are described briefly here.

As shown in FIG. 6, the computer system 610 may include a communication mechanism such as a bus 621 or other communication mechanism for communicating information within the computer system 610. The computer system 610 further includes one or more processors 620 coupled with the bus 621 for processing the information. The processors 620 may include one or more central processing units (CPUs), graphical processing units (GPUs), or any other processor known in the art.

The computer system 610 also includes a system memory 630 coupled to the bus 621 for storing information and instructions to be executed by processors 620. The system memory 630 may include computer readable storage media in the form of volatile and/or nonvolatile memory, such as read only memory (ROM) 631 and/or random access memory (RAM) 632. The system memory RAM 632 may include other dynamic storage device(s) (e.g., dynamic RAM, static RAM, and synchronous DRAM). The system memory ROM 631 may include other static storage device (s) (e.g., programmable ROM, erasable PROM, and electrically erasable PROM). In addition, the system memory 630 may be used for storing temporary variables or other intermediate information during the execution of instructions by the processors 620. A basic input/output system 633 (BIOS) containing the basic routines that help to transfer information between elements within computer system 610, such as during start-up, may be stored in ROM 631. RAM 632 may contain data and/or program modules that are immediately accessible to and/or presently being operated on by the processors 620. System memory 630 may additionally include, for example, operating system 634, application programs 635, other program modules 636 and program data 637.

The computer system 610 also includes a disk controller 640 coupled to the bus 621 to control one or more storage devices for storing information and instructions, such as a hard disk 641 and a removable media drive 642 (e.g., floppy disk drive, compact disc drive, tape drive, and/or solid state drive). The storage devices may be added to the computer system 610 using an appropriate device interface (e.g., a small computer system interface (SCSI), integrated device electronics (IDE), Universal Serial Bus (USB), or FireWire).

The computer system 610 may also include a display controller 665 coupled to the bus 621 to control a display 666, such as a cathode ray tube (CRT) or liquid crystal display (LCD), for displaying information to a computer user. The computer system includes an input interface 660 and one or more input devices, such as a keyboard 662 and a pointing device 661, for interacting with a computer user and providing information to the processor 620. The pointing device 661, for example, may be a mouse, a trackball, or a pointing stick for communicating direction information and command selections to the processor 620 and for controlling cursor movement on the display 666. The display 666 may provide a touch screen interface which allows input to supplement or replace the communication of direction information and command selections by the pointing device 661.

The computer system 610 may perform a portion or all of the processing steps of embodiments of the invention in response to the processors 620 executing one or more sequences of one or more instructions contained in a memory, such as the system memory 630. Such instructions may be read into the system memory 630 from another computer readable medium, such as a hard disk 641 or a removable media drive 642. The hard disk 641 may contain one or more datastores and data files used by embodiments of the present invention. Datastore contents and data files may be encrypted to improve security. The processors 620 may also be employed in a multi-processing arrangement to execute the one or more sequences of instructions contained in system memory 630. In alternative embodiments, hard-wired circuitry may be used in place of or in combination with software instructions. Thus, embodiments are not limited to any specific combination of hardware circuitry and software.

As stated above, the computer system 610 may include at least one computer readable medium or memory for holding instructions programmed according embodiments of the invention and for containing data structures, tables, records, or other data described herein. The term "computer readable medium" as used herein refers to any medium that participates in providing instructions to the processor 620 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 641 or removable media drive 642. Non-limiting examples of volatile media include dynamic memory, such as system memory 630. Non-limiting examples of transmission media include coaxial cables, copper wire, and fiber optics, including the wires that make up the bus 621. Transmission media may also take the form of acoustic or light waves, such as those generated during radio wave and infrared data communications.

The computing environment 600 may further include the computer system 610 operating in a networked environment using logical connections to one or more remote computers, such as remote computer 680. Remote computer 680 may be a personal computer (laptop or desktop), a mobile device, a server, a router, a network PC, a peer device or other common network node, and typically includes many or all of the elements described above relative to computer system 610. When used in a networking environment, computer system 610 may include modem 672 for establishing communications over a network 671, such as the Internet. Modem 672 may be connected to bus 621 via user network interface 670, or via another appropriate mechanism.

Network 671 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 610 and other computers (e.g., remote computer 680). The network 671 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 671.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for.

We claim:

1. A computer-implemented method for performing multiband slice accelerated imaging, the method comprising:
    performing a low-resolution fast multi-dimensional reference scan to obtain a coil sensitivity map;
    receiving an indication of a desired Field Of View ("FOV") shift,
    determining a desired gradient moment for phase modulation to achieve the desired FOV shift;
    performing a multiband imaging scan to acquire a plurality of k-space lines representative of an anatomical area of interest, wherein balanced slice-selective gradients are used for phase modulation of each k-space line according to the desired gradient moment;
    separating a multi-band signal corresponding to the plurality of k-space lines into a plurality of image slices using a parallel imaging reconstruction technique and the coil sensitivity map.

2. The method of claim 1, further comprising:
    wherein a gradient moment rewinding process is applied after acquisition of each k-space line during the multiband imaging scan.

3. The method of claim 2, wherein the balanced slice-selective gradients comprise:
    a first slice-selective gradient applied prior to acquisition of each k-space line to set a gradient moment to a phase modulation corresponding to the desired FOV shift; and
    a second slice-selective gradient applied during the gradient moment rewinding process to set the gradient moment to zero in a slice direction.

4. The method of claim 1, wherein the low-resolution fast multi-dimensional reference scan and the multiband imaging scan are each associated with a different image contrast.

5. The method of claim 1, wherein the low-resolution fast multi-dimensional reference scan and the multiband imaging scan are each associated with a different spatial resolution.

6. The method of claim 1, wherein the low-resolution fast multi-dimensional reference scan corresponds to a multi-slice 2D scan and the multiband imaging scan corresponds to a 2D multi-slice or 3D image scan.

7. The method of claim 1, wherein the low-resolution fast multi-dimensional reference scan corresponds to a single-slab or multi-slab 3D image scan and the multiband imaging scan corresponds to a 2D multi-slice or 3D image scan.

8. The method of claim 1, wherein the multiband imaging scan simultaneously excites multiple slabs in the anatomical area of interest.

9. A method for performing multi-band slice accelerated imaging with balanced slice-selective gradients, the method comprising:
    receiving an indication of a desired FOV shift;
    determining a phase modulation value based on the desired FOV shift; and
    performing a multiband imaging scan to acquire a plurality of k-space lines representative of an anatomical area of interest, wherein balanced slice-selective gradients are utilized with gradient moment rewinding after acquisition of each k-space line to achieve the desired FOV shift.

10. The method of claim 9, wherein the desired FOV shift corresponds to a one-half FOV shift and the phase modulation value alternates between 0 degrees and 180 degrees for consecutive k-space lines during the multiband imaging scan.

11. The method of claim 9, wherein the desired FOV shift corresponds to a one-third FOV shift and the phase modulation value cycles over values comprising 0 degrees, 120 degrees, and 240 degrees for consecutive k-space lines during the multiband imaging scan.

12. The method of claim 9, wherein the multiband imaging scan simultaneously excites multiple slabs in the anatomical area of interest.

13. The method of claim 9, further comprising:
    performing a multi-dimensional reference scan using a low resolution fast imaging sequence to obtain a coil sensitivity map;
    separating aliased slices in the plurality of k-space lines using a parallel imaging reconstruction technique and the coil sensitivity map.

14. The method of claim 9, further comprising:
    convert the plurality of k-space lines into image space data; and
    separating aliased slices in the image space data using a phase-offset multi-planar (POMP) imaging technique.

15. The method of claim 9, further comprising:
    convert the plurality of k-space lines into image space data; and
    separating aliased slices in the image space data using a phase-offset Hadamard encoding imaging technique.

16. The method of claim 9, wherein the multiband imaging scan utilizes a non-Cartesian k-space trajectory.

17. A system for performing multi-band slice accelerated imaging, the system comprising:
    a plurality of imaging coils comprising:
        a plurality of gradient coils, and
        a plurality of radio-frequency (RF) coils; and
    a central control computer configured to:
        obtain a coil sensitivity map by performing a low-resolution fast multi-dimensional reference scan using the plurality of imaging coils,
        determining a desired gradient moment for phase modulation to achieve the desired FOV shift,
        perform a multiband imaging scan using the plurality of imaging coils, wherein the plurality of gradient coils apply balanced slice-selective gradients using the desired gradient moment for phase modulation and the plurality of RF coils acquire a plurality of k-space lines representative of an anatomical area of interest, and
        separate a multi-band signal corresponding to the plurality of k-space lines into a plurality of image slices using a parallel imaging reconstruction technique and the coil sensitivity map.

18. The system of claim 17, further comprising:
    an operator interface configured to receive an indication of the desired FOV shift,
    wherein a gradient moment rewinding process is applied after acquisition of each k-space line during the multiband imaging scan.

19. The system of claim 18, wherein the central control computer is further configured to utilize the plurality of gradient coils to:
    apply a first slice-selective gradient prior to acquisition of each k-space line to set a gradient moment to a phase modulation corresponding to the desired FOV shift; and apply a second slice-selective gradient during the gradient moment rewinding process to set the gradient moment to zero in a slice direction.

20. The system of claim 17, the central control computer is further configured to modify the multiband imaging scan such that the plurality of imaging coils simultaneously excites multiple slabs in the anatomical area of interest during the multiband imaging scan.

\* \* \* \* \*